US010347995B2

(12) United States Patent
Kita

(10) Patent No.: US 10,347,995 B2
(45) Date of Patent: Jul. 9, 2019

(54) CIRCUIT STRUCTURE AND TERMINAL

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Yukinori Kita, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 15/754,762

(22) PCT Filed: Aug. 18, 2016

(86) PCT No.: PCT/JP2016/074069
§ 371 (c)(1),
(2) Date: Feb. 23, 2018

(87) PCT Pub. No.: WO2017/043280
PCT Pub. Date: Mar. 16, 2017

(65) Prior Publication Data
US 2018/0248273 A1 Aug. 30, 2018

(30) Foreign Application Priority Data
Sep. 8, 2015 (JP) .................................. 2015-176301

(51) Int. Cl.
*H01R 4/02* (2006.01)
*H01R 11/01* (2006.01)
(Continued)

(52) U.S. Cl.
CPC ............. *H01R 4/023* (2013.01); *H01R 11/01* (2013.01); *H01R 12/50* (2013.01);
(Continued)

(58) Field of Classification Search
CPC .... H01R 4/023; H01R 43/0235; H01R 12/50; H01R 11/01; H02G 3/16; H05K 3/202; H05K 1/11
(Continued)

(56) References Cited

U.S. PATENT DOCUMENTS 4,647,126 A * 3/1987 Sobota, Jr. ............. H01R 12/57
361/773
4,739,125 A * 4/1988 Watanabe ......... H01L 23/49555
174/528
(Continued)

FOREIGN PATENT DOCUMENTS

JP S56-52870 U 9/1981

OTHER PUBLICATIONS

Search Report for PCT/JP2016/074069, dated Nov. 15, 2016.

*Primary Examiner* — Abdullah A Riyami
*Assistant Examiner* — Nelson R. Burgos-Guntin
(74) *Attorney, Agent, or Firm* — Honigman LLP

(57) ABSTRACT

A circuit structure disclosed in the present specification includes: a circuit board provided with a wiring portion; a conductor body (conductor plate) adhered to one side of the circuit board; and a terminal that electrically connects the wiring portion of the circuit board and the conductor body. The terminal includes a relay connection portion between a portion connected to the wiring portion and a portion connected to the conductor body, and the relay connection portion protrudes past the wiring portion, on the other side of the circuit board.

7 Claims, 10 Drawing Sheets

(51) Int. Cl.
  *H01R 12/50* (2011.01)
  *H01R 43/02* (2006.01)
  *H02G 3/16* (2006.01)
  *H05K 3/40* (2006.01)
(52) U.S. Cl.
  CPC ........... *H01R 43/0235* (2013.01); *H02G 3/16* (2013.01); *H05K 3/4015* (2013.01)
(58) Field of Classification Search
  USPC ........... 439/83, 507, 876; 361/775, 760, 772
  See application file for complete search history.

(56) References Cited

U.S. PATENT DOCUMENTS

| | | | | |
|---|---|---|---|---|
| 5,910,885 A * | 6/1999 | Gulachenski | ......... | H01L 25/105 257/E25.023 |
| 6,685,514 B2 * | 2/2004 | Costa | ..................... | H01R 4/625 156/276 |
| 7,074,055 B2 * | 7/2006 | Yang | ................... | H01R 13/113 439/342 |
| 7,357,651 B2 * | 4/2008 | Minoura | ............... | H01R 13/111 439/82 |
| 7,575,488 B2 * | 8/2009 | Lee | .................... | H01M 2/0404 439/82 |
| 7,621,784 B2 * | 11/2009 | Ichimiya | ................ | H01R 12/57 439/676 |
| 8,419,447 B2 * | 4/2013 | Freedman | ............. | H01R 12/57 439/247 |
| 8,672,718 B2 * | 3/2014 | Suzuki | ................... | H01R 12/57 439/876 |
| 2002/0179330 A1 * | 12/2002 | Carson | ............... | H01L 23/3114 174/260 |
| 2004/0072477 A1 * | 4/2004 | Templin | ................ | H01R 9/096 439/876 |
| 2004/0214480 A1 * | 10/2004 | Kitajima | ............. | H01R 13/055 439/876 |
| 2005/0042941 A1 * | 2/2005 | Keating | ................ | H01R 12/57 439/876 |
| 2008/0080151 A1 * | 4/2008 | Shimizu | ............... | H05K 1/0263 361/760 |
| 2009/0318036 A1 * | 12/2009 | Masuda | ............ | H01R 13/6315 439/876 |
| 2015/0222035 A1 * | 8/2015 | Kurita | ................. | H05K 9/0016 439/876 |

* cited by examiner

PRIOR ART

PRIOR ART

PRIOR ART

CIRCUIT STRUCTURE AND TERMINAL

This application is the U.S. national stage of PCT/JP2016/074069 filed Aug. 18, 2016, which claims priority of Japanese Patent Application No. JP 2015-176301 filed Sep. 8, 2015.

TECHNICAL FIELD

The technology disclosed in the present specification is related to a circuit structure and a terminal.

BACKGROUND

Conventionally, the technology disclosed for example in JP 2005-224053A (hereinafter "JP 2005-224053A") is known as a circuit structure that includes a control circuit board provided with bus bars that are part of a power circuit built into an automobile or the like, and a control circuit thereof. A circuit structure with a configuration similar to such a circuit structure will be described with reference to FIGS. 8 to 10. A circuit structure 1 shown in FIG. 8 has a configuration including a bus bar component plate 3 that has a plurality of bus bars 2 and a control circuit board 4 that is adhered to the upper face of the bus bar component plate 3. A substantially rectangular through-hole 5 is provided in the control circuit board 4, and an upper face 6 of a bus bar 2 is exposed through this through-hole 5. On the other hand, the control circuit board 4 is provided with a conductor pad 7, and the conductor pad 7 is provided at a position higher than the upper face 6 of the bus bar 2. As shown in FIG. 9, a solder 8 in the form of paste is applied to the upper face 6 of the bus bar 2, a solder 8 in the form of paste is also applied to the conductor pad 7, and passing these through a reflow furnace in a state in which a crank-shaped terminal 9 is placed onto the solders 8 results in the circuit structure 1 shown in FIG. 8.

There are cases where the circuit structure 1 described above that has been passed through a reflow furnace turns out to be a faulty product as shown in FIG. 10. As a factor leading to such a faulty product, it is conceivable that, after the solders 8 have melted in the reflow furnace, a melted solder 8 creeps up toward the conductor pad 7 along the terminal 9, and due to surface tension between the melted solder 8 and the terminal 9, simultaneously pulls the terminal 9 up onto the conductor pad 7. Therefore, a state in which the upper face 6 of the bus bar 2 and the conductor pad 7 are not connected by the terminal 9, in other words, electrical conduction failure, occurs.

SUMMARY

The circuit structure disclosed in the present specification includes: a circuit board provided with a wiring portion; a conductor body adhered to one side of the circuit board; and a terminal that electrically connects the wiring portion of the circuit board to the conductor body. The terminal includes a relay connection portion arranged between a portion connected to the wiring portion and a portion connected to the conductor body, and the relay connection portion protrudes past the wiring portion, on the other side of the circuit board.

Also, it is preferable that the terminal disclosed in the present specification is a terminal that electrically connects a wiring portion provided on a circuit board and a conductor body that is adhered to one side of the circuit board, and the terminal includes: a relay connection portion arranged between a portion connected to the wiring portion and a portion connected to the conductor body, wherein the relay connection portion protrudes past the wiring portion, on the other side of the circuit board.

With such a configuration, by passing solders through a reflow furnace in a state in which a solder in the form of a paste is applied to the conductor body and the wiring portion, and the portion connected to the conductor body and the portion connected to the wiring portion are placed onto the solders, the portion connected to the conductor body is soldered to the conductor body, the portion connected to the wiring portion is soldered to the wiring portion, and the conductor body and the wiring portion of the circuit board are conductably connected, via the terminal. Here, if the melted solder on the conductor body attempts to creep up to the wiring portion via the terminal, the flow of the solder is cut off at the relay connection portion, and thus creeping up of the solder can be prevented, and a situation in which the terminal is pulled up onto the wiring portion can be avoided. Accordingly, the conductor body and the wiring portion of the circuit board are connected to each other by the terminal, and electrical conduction failure can be eliminated.

The circuit structure according to the present specification may have the following configurations.

The circuit board has a configuration including, a through-hole that exposes a terminal connection portion provided on the conductor body in a state adhered to the conductor body, and in the through-hole, a fillet shaped solder is formed spanning from a conductor made of copper exposed at an end of the portion connected to the conductor body to a surface of the terminal connection portion.

With such a configuration, due to a fillet shaped solder being formed in the through-hole, it is possible to confirm that the terminal is correctly soldered to the terminal connection portion of the conductor body.

The relay connection portion of the terminal has a configuration including a first linking portion that extends upward from the portion connected to the conductor body, and a second linking portion that extends downward toward the portion connected to the wiring portion and is shorter than the first linking portion.

With such a configuration, due to the relay connection portion being located higher than the portion connected to the wiring portion, the melted solder needs to move over the relay connection portion from the portion connected to the conductor body in order to reach the portion connected to the wiring portion, and thus the creeping up of the solder can be easily prevented.

It is preferable that the relay connection portion of the terminal is configured in a gate shape protruding laterally along the circuit board, and the portion connected to the conductor body and the relay connection portion are linked via a step portion, and the portion connected to the wiring portion and the relay connection portion are directly connected to and are flush with each other.

With such a configuration, the relay connection portion is arranged running along the circuit board, and thus the seated orientation of the terminal relative to the circuit board is stable. Also, because the portion connected to the wiring portion and the relay connection portion are flush with each other, an increase in the size of the terminal in the up-down direction can be prevented.

Advantageous Effects of Invention

With the circuit structure disclosed in the present specification, creeping up of a solder can be prevented, and a situation where the terminal is pulled up onto the wiring portion of the circuit board can be avoided.

DETAILED DESCRIPTION OF PREFERRED EMBODIMENTS

Embodiment 1

Figure 1:
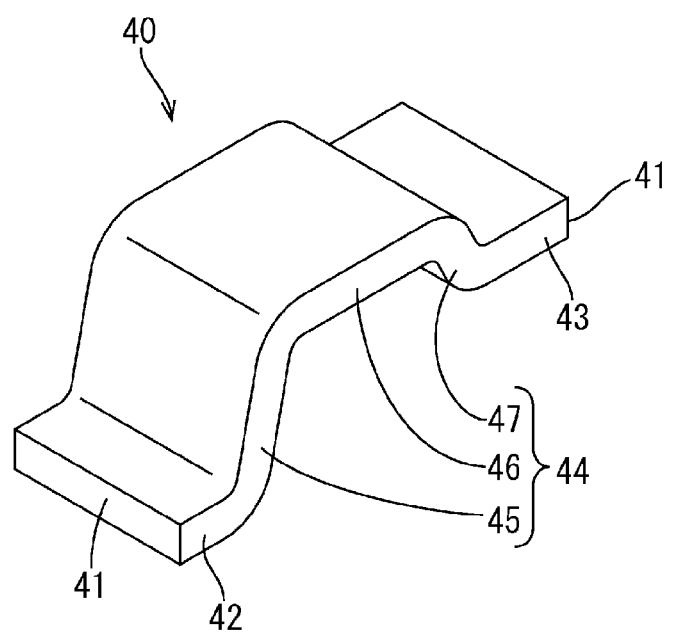
FIG. 1 is a perspective view of a terminal according to Embodiment 1.

Embodiment 1 will be described with reference to the drawings in FIGS. 1 to 4. As shown in FIG. 3, a circuit structure 10 according to the present embodiment has a configuration including a conductor plate 30, a circuit board 20 adhered to the upper face of the conductor plate 30, and a terminal 40. The conductor plate 30 is formed by punching out a predetermined shape from an electrically conductive metal plate, which is the base material thereof, and a plating layer 31 such as a nickel plating layer is formed on the upper face of the conductor plate 30. The upper face of this plating layer 31 is fixed to the circuit structure 20 via an adhesive 21. The conductor plate 30 is a bus bar that is part of a power circuit that is built into an automobile or the like.

The circuit board 20 is a control circuit board provided with a control circuit that controls power passing through the conductor plate 30, and has a configuration including a substrate 22 made of a synthetic resin, a circuit pattern 23 formed on the upper face of the substrate 22, and an electrical insulation film 24 applied to the upper face of the circuit pattern 23. The substrate 22 is an insulative plate member made of glass epoxy or polyimide, for example. The circuit pattern 23 is a pattern formed by etching a metal plate material made of copper foil for example, and is electrically conductive. The insulating film 24 is a resin coating made of a solder resist or the like, and fulfils the role of repelling solders 50 in the form of paste to prevent the solders 50 from sticking to the circuit pattern.

Figure 4:
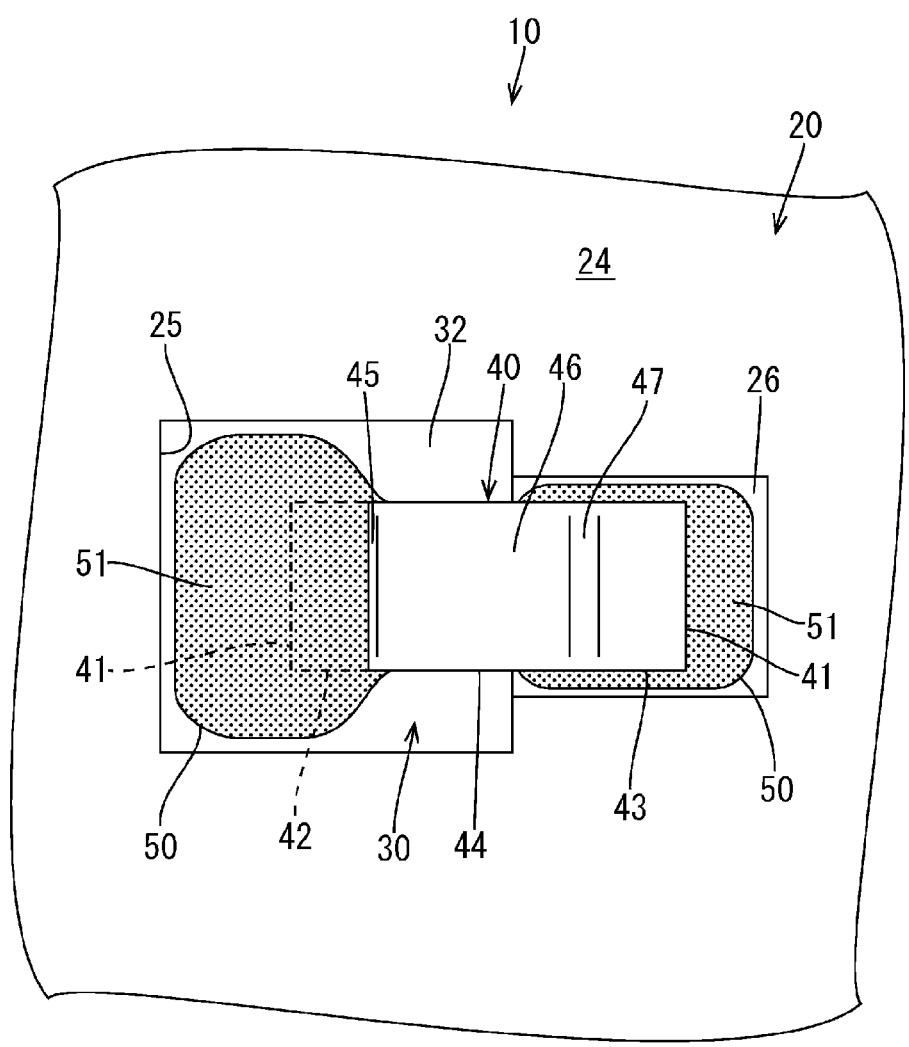
FIG. 4 is a plan view showing a circuit structure after being subjected to reflow.

A through-hole 25 is provided in the circuit board 20, and a portion of the upper face of the conductor plate 30 is exposed through this through-hole 25. This exposed portion serves as a terminal connection portion 32. On the other hand, at a position adjacent to the through-hole 25 in the circuit board 20, a wiring portion 26 is provided at which a portion of the circuit pattern 23 is exposed due to the insulating film 24 not being formed there. The wiring portion 26 is located at a position higher than the terminal connection portion 32. Specifically, the wiring portion 26 is located at a position higher than the terminal connection portion 32 by a height that corresponds to the total thickness of the adhesive 21, the substrate 22, and the circuit pattern 23. As shown in FIG. 4, the terminal connection portion 32 and the wiring portion 26 are provided lined up in the horizontal direction, and the terminal connection portion 32 is made to be larger than the wiring portion 26.

The terminal connection portion 32 and the wiring portion 26 are conductably connected, via the terminal 40. The terminal 40 is a terminal made by performing tin plating, nickel plating, or the like on a wire material made of copper, cutting it to a predetermined length, and bending it. Thus, conductors made of copper are exposed at both ends 41 of the terminal 40. As shown in FIG. 3, the terminal 40 has a configuration including a conductor plate connection portion 42 to be soldered to the terminal connection portion 32, a circuit board connection portion 43 to be soldered to the wiring portion 26, and a relay connection portion 44 that relays connection between the conductor plate connection portion 42 and the circuit board connection portion 43. The two ends 41 of the terminal 40 are provided at the conductor plate connection portion 42 and the circuit board connection portion 43, respectively.

The relay connection portion 44 has a configuration including a first linking portion 45 extending upward from the conductor plate connection portion 42, a circumvention portion 46 extending horizontally from an extension end of the first linking portion 45, and a second linking portion 47 extending down toward the circuit board connection portion 43 from an extension end of the circumvention portion 46. The circumvention portion 46 is located at a position higher than the circuit board connection portion 43, and the second linking portion 47 is made to be shorter than the first linking portion 45. As a result, a space 48 in which the flow of the melted solder 50 is cut off, is formed between the circumvention portion 46 and the terminal connection portion 32.

Figure 2:
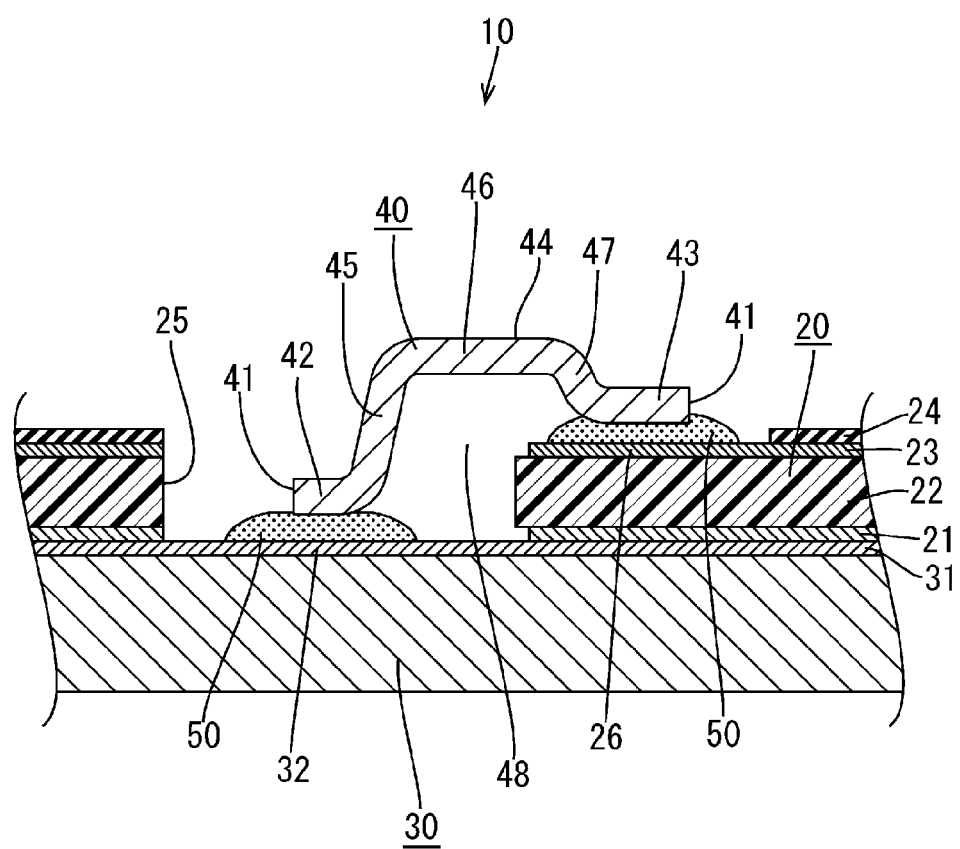
FIG. 2 is a cross-sectional diagram showing a circuit body before being subjected to reflow.
Figure 3:
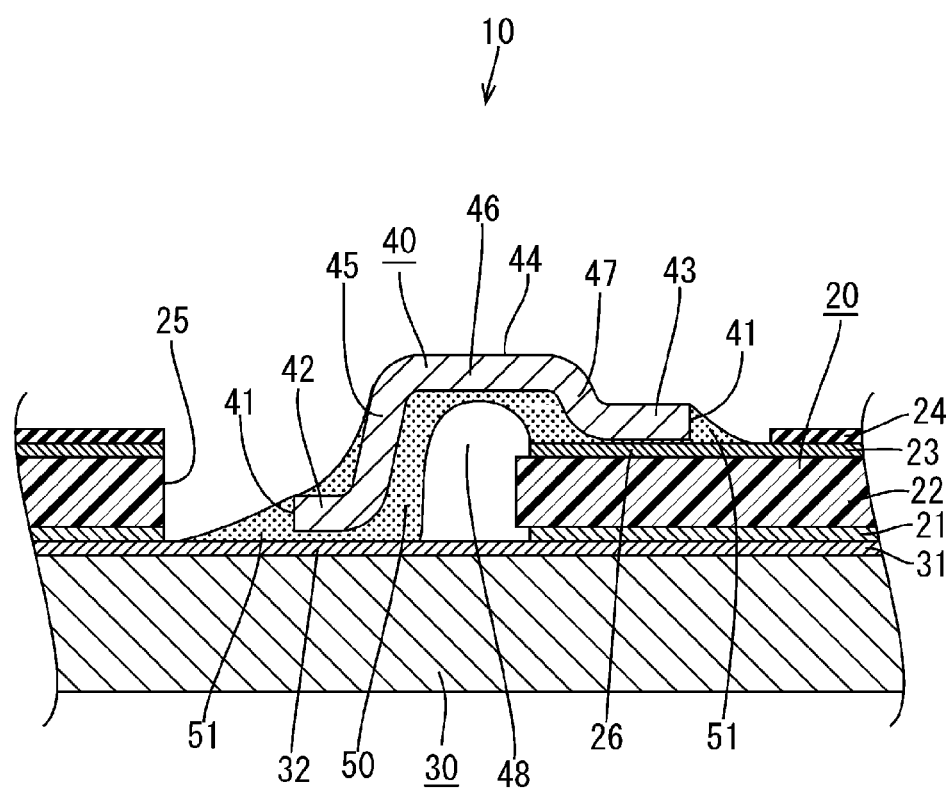
FIG. 3 is a cross-sectional diagram showing the circuit body after being subjected to reflow.

As shown in FIG. 2, in a solder paste printing step, a solder 50 in the form of paste is applied to the terminal connection portion 32 and to the wiring portion 26, and in a following part placing step, the terminal 40 is placed onto the solders 50. Next, in the reflowing step, the circuit structure 10 on which the terminal 40 has been placed is passed through a reflow furnace to melt the solders 50, and the solder 50 at the terminal connection portion 32 and the wiring portion 26 spread out. At this time, despite one of the solders 50 spreading out from the terminal connection terminal 32, along the terminal 40, toward the wiring portion 26, not all of the solder 50 on the terminal connection portion 32 spreads out to the wiring portion 26.

As shown in FIG. 3, the space 48 remains formed below the circumvention portion 46. In other words, the amount of the solder 50 is set to be insufficient to fill the space 48, even if the amount of solder 50 applied to the terminal connection portion 32 and the amount of the solder 50 applied to the wiring portion 26 are combined. Accordingly, it is desirable to set the height position of the circumvention portion 46 so that the volume of the space 48 provided under the circumvention portion 46 is larger than the combined amount of the solder 50 at the terminal connection portion 32 and the solder 50 at the wiring portion 26. In this way, because the space 48 is not filled by the solder 50, a situation in which solder 50 creeps up from the terminal connection portion 32 to the wiring portion 26 will not occur.

Figure 8:
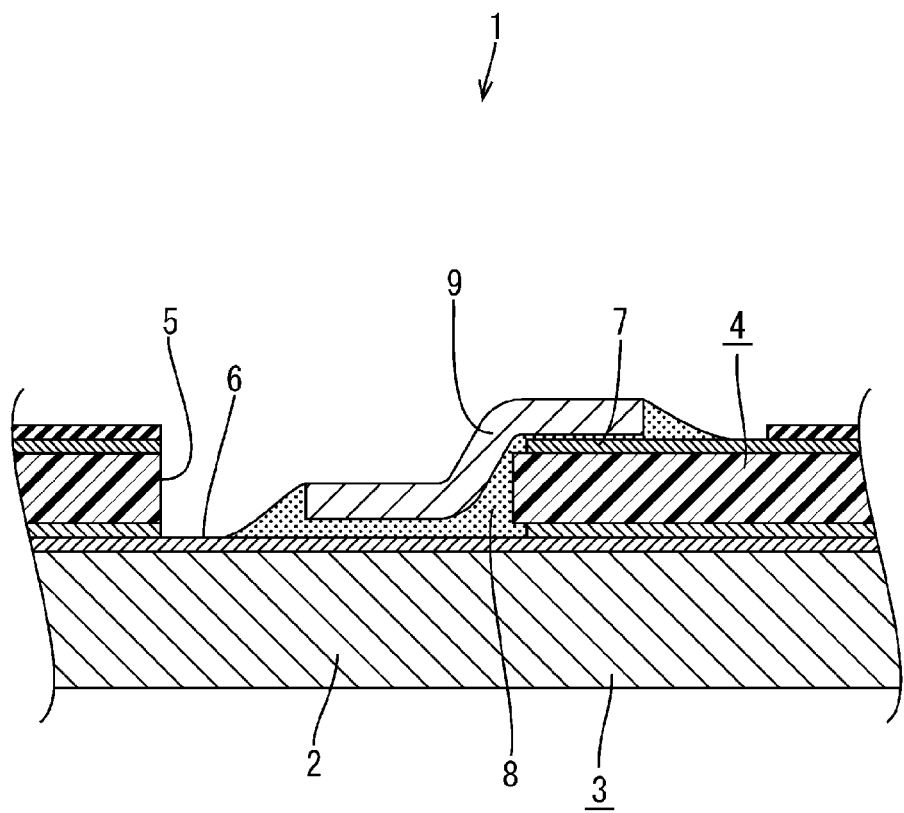
FIG. 8 is a cross-sectional diagram showing a conventional circuit structure after having been subjected to reflow.
Figure 9:
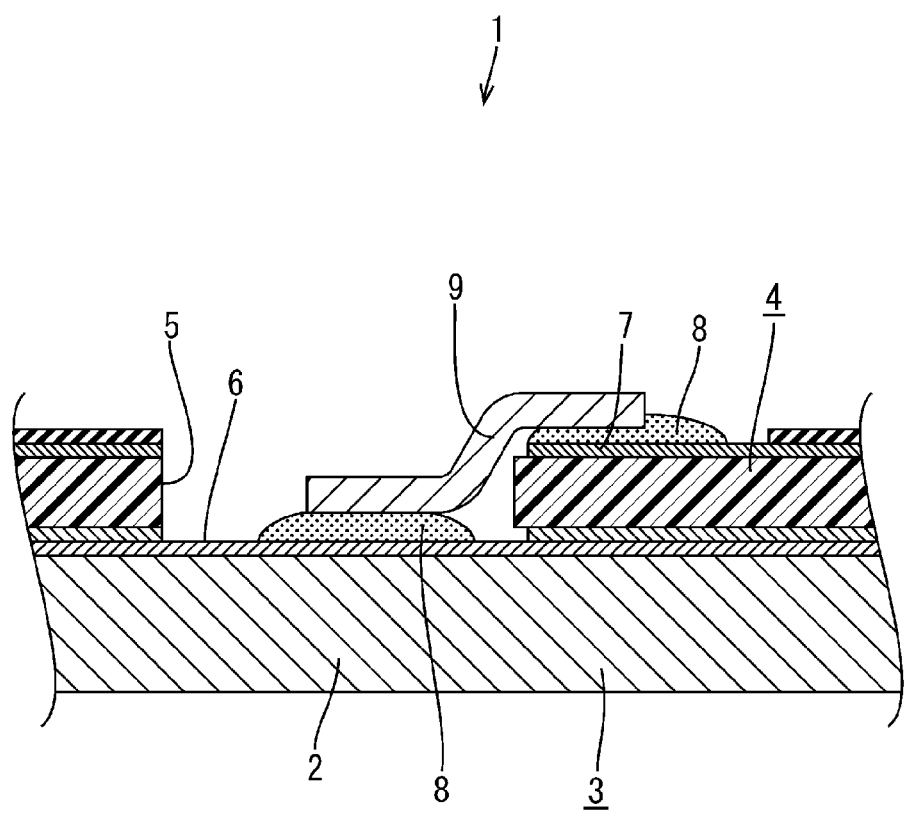
FIG. 9 is a cross-sectional diagram showing the conventional circuit structure before being subjected to reflow.
Figure 10:
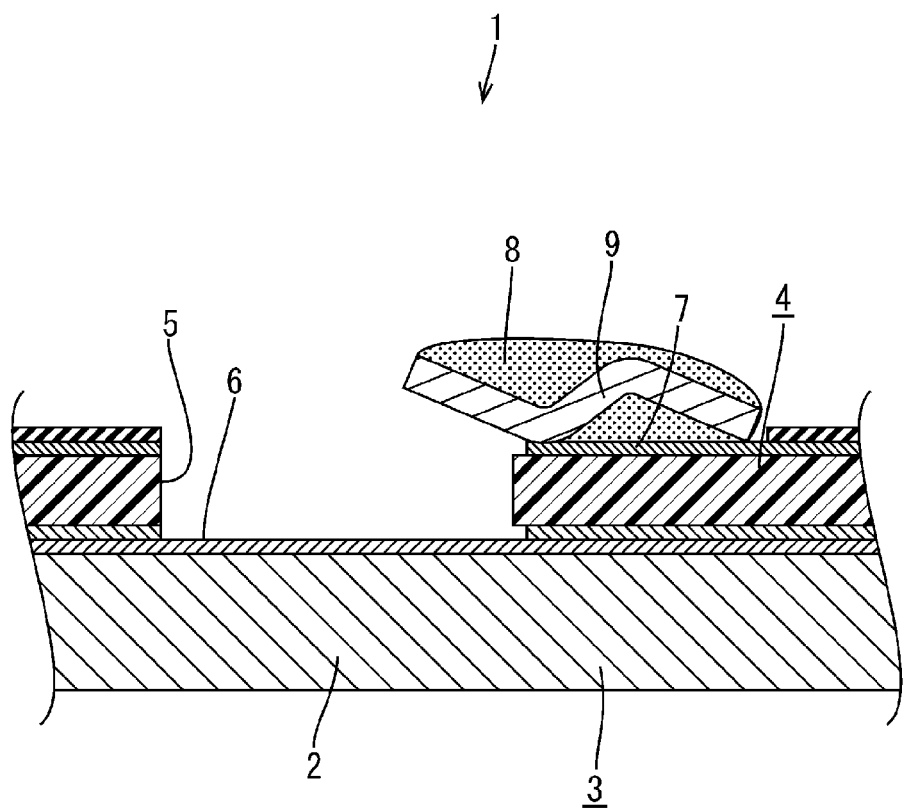
FIG. 10 is a cross-sectional diagram showing a conventional faulty product after having been subjected to reflow.

As shown in FIGS. 3 and 4, a fillet-shaped skirt portion 51 is formed by the solder 50 spreading out on the connector terminal portion 32. This is because conductors made of copper are exposed at the two ends 41 of the terminal 40. As shown in FIG. 4, the skirt portion 51 expands over a wide region on the terminal connection portion 32, and thus it is easy to confirm that the soldering has been performed correctly. Also, despite not being as wide-spread as the one on the terminal connection portion 32, a skirt portion 51 spreading over a wide range is also formed on the wiring portion 26, and thus, it is easy to confirm that the soldering has been performed correctly. Also, the terminal 40 according to the present embodiment has an overall length longer than a structure such as that of the terminal 9 shown in FIG. 8 that does not have the relay connection portion 44, and thus it is possible to greatly reduce stress that acts on the terminal 40.

As described above, in the present embodiment, by passing solders through a reflow furnace in a state in which the solder 50 in the form of paste is applied to the conductor body (conductor plate 30) and the wiring portion 26, and a connection portion connected to the conductor body (conductor plate connection portion 42) and a portion connected to the wiring portion (circuit board connection portion 43) are placed onto the solder 50, the portion connected to the conductor body is soldered to the conductor body, the portion connected to the wiring portion is soldered to the wiring portion 26, and the conductor body and the wiring portion 26 of the circuit board 20 are conductably connected to each other, via the terminal 40. Here, if the solder 50 on the conductor body attempts to creep up along the terminal 40 to the wiring portion 26, the flow of the solder 50 is cut off at the relay connection portion 44, and thus creeping up of the solder 50 can be prevented, and a situation in which the terminal 40 is pulled up onto the wiring portion 26 can be avoided. Accordingly, the conductor body and the wiring portion 26 of the circuit board 20 are connected by the terminal 40, and electrical conduction failure can be eliminated.

In a state adhered to the conductor body, the circuit board 20 has the through-hole 25 that exposes the terminal connection portion 32 provided on the conductor body, and a configuration is employed in which, in the through-hole 25, the solder 50 is formed in a fillet shape spanning from the conductor made of copper exposed at the end 41 of the conductor plate connection portion 42 to the surface of the terminal connection portion 32.

With such a configuration, due to the fillet-shaped solder 50 being formed in the through-hole 25, it can be confirmed that the terminal 40 has been properly soldered to the terminal connection portion 32 of the conductor plate 30.

The relay connection portion 44 of the terminal 40 is provided with the first linking portion 45 that extends upward from the portion connected to the conductor body (conductor plate connection portion 42), and the second linking portion 47 that extends downward toward the portion connected to the portion connected to the wiring portion 26 (circuit board connection portion 43) and is shorter than the first linking portion 45.

With such a configuration, the relay connection portion 44 is located at a position higher than the wiring portion-connection portion (circuit board connection portion 43), and thus the melted solder 50 needs to move over and past the relay connection portion 44 from the portion connected to the conductor body (conductor plate connection portion 42) to reach the portion connected to the wiring portion (circuit board connection portion 43), and thus it is easy to prevent creeping up of a solder 50.

Embodiment 2

Figure 5:
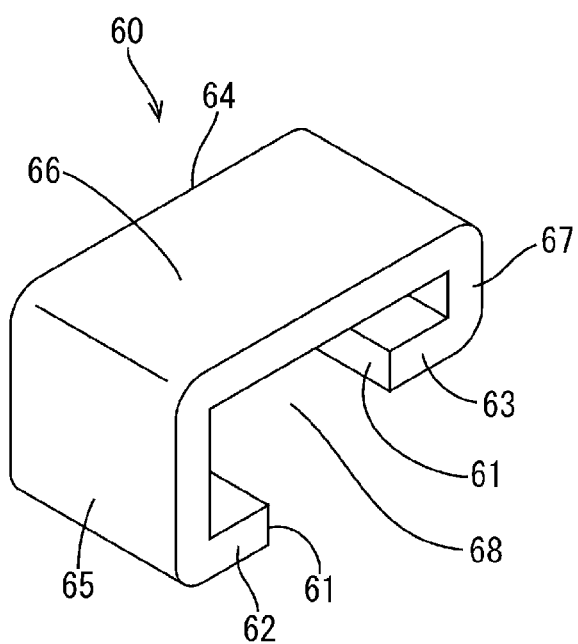
FIG. 5 is a perspective view of a terminal according to Embodiment 2.

Next, Embodiment 2 will be described using the drawing in FIG. 5. The present embodiment is an embodiment in which the shape of the terminal 40 according to Embodiment 1 has been changed, but otherwise has the same configuration. A terminal 60 according to the present embodiment has a configuration including a conductor plate connection portion 62, a first linking portion 65 that extends upward from the conductor plate connection portion 62, a circumvention portion 66 that extends horizontally from an extension end of the first linking portion 65, a second linking portion 67 that extends downward from an extension end of the circumvention portion 66, and a circuit board connection portion 63 that extends horizontally from an extension end of the second linking portion 67.

The terminal 40 according to Embodiment 1, in which the two ends 41 at the conductor plate connection portion 42 and the circuit board connection portion 43 face outward, is different to the terminal 60 according to the present embodiment in that two ends 61 at the conductor plate connection portion 62 and the circuit board connection portion 63, respectively, face inward. Also, the terminal 40 according to Embodiment 1, in which the first linking portion 45 and the second linking portion 47 are inclined, is different to the terminal 60 according to the present embodiment in that the first linking portion 65 and the second linking portion 67 are arranged at right angles to the circumvention portion 66. With such a configuration, a relay connection portion 64 including the first linking portion 65, the circumvention portion 66, and the second linking portion 67 is longer than the relay connection portion 44 according to Embodiment 1, and a space 68 is larger, and thus the solder 50 can be more easily prevented from creeping up.

Embodiment 3

Figure 6:
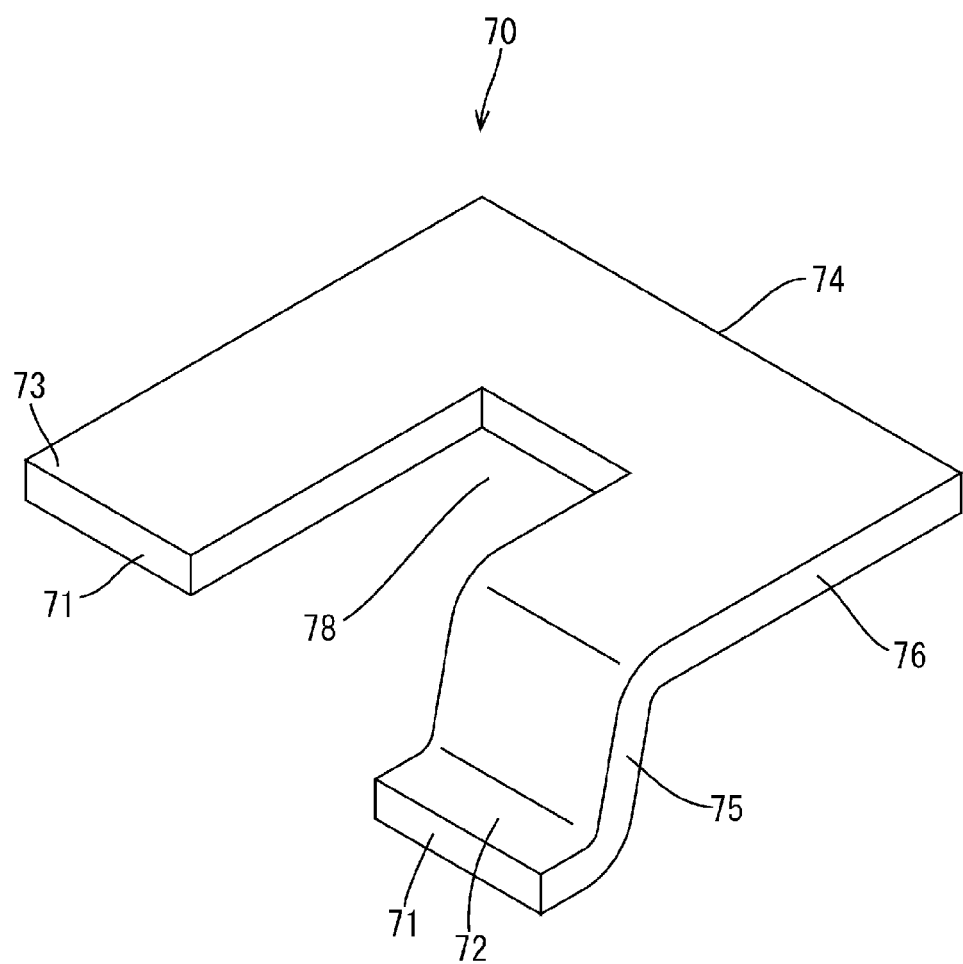
FIG. 6 is a perspective view of a terminal according to Embodiment 3.
Figure 7:
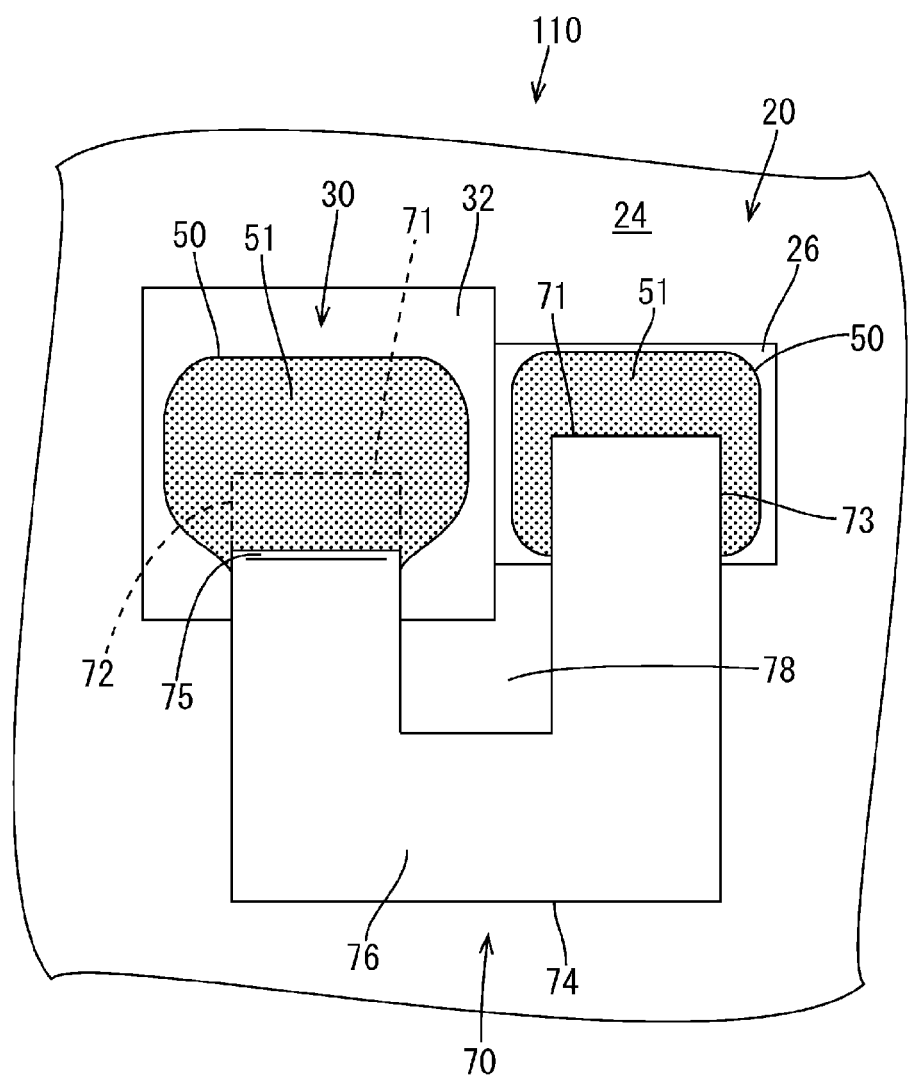
FIG. 7 is a plan view showing the circuit structure after being subjected to reflow.

Next, the Embodiment 3 will be described using the drawings in FIGS. 6 and 7. The present embodiment is an embodiment in which the shape of the terminal 40 according to Embodiment 1 has been changed, but otherwise has the same configuration, and thus like reference signs are used for like configurations, and redundant descriptions are omitted.

A circuit structure 110 according to the present embodiment has a configuration including the circuit board 20, the conductor plate 30, and a terminal 70. The terminal 70 has a configuration including a conductor plate connection portion 72, a step portion 75 that rises upward from the conductor plate connection portion 72, a relay connection portion 74 that extends horizontally from an upper end of the step portion 75, in a gate shape, and a circuit board connection portion 73 that is directly connected to and is flush with the relay connection portion 74. As shown in FIG. 7, the relay connection portion 74 does not protrude upward, and takes the mode of protruding laterally along the upper face of the circuit structure 20. Even in such a configuration, a space 78 is formed inward of the relay connection portion 74, and the flow of a solder 50 can be cut off by this space 78. Note that two ends 71 of the terminal 70 both face in the same direction, and the skirt portions 51 of the solder 50 according to the present embodiment are larger than those in Embodiments 1 and 2.

In other words, in the present embodiment, the relay connection portion 74 of the terminal 70 protrudes laterally along the circuit board 20 in the shape of a gate, the portion connected to the conductor body (conductor plate connection portion 72) and the relay connection portion 74 are linked via the step portion 75, but the circuit board connection portion 73 and the relay connection portion 74 are directly connected to and are flush with each other, which results in the relay connection portion 74 being arranged running along the circuit board 20, and thus the seated orientation of the terminal 70 relative to the circuit board 20 is stable. Also, a portion connected to the wiring portion 26 (circuit board connection portion 73) and the relay connection portion 74 are flush with each other, and thus an increase in the size of the terminal 70 in the up-down direction can be avoided.

Other Embodiments

The technology disclosed in the present specification is not limited to the embodiments described using the above description and the drawings, and includes various aspects such as the following, for example.

In the above embodiments, gate-shaped relay connection portions 44, 64, and 74 were illustrated, but they do not need to have a gate shape, and an arch-shaped relay connection portion may be employed, for example.

In the above embodiments, the terminal connection portion 32 is exposed by providing the through-hole 25, but the terminal connection portion may also be exposed at an edge portion of the circuit board 20 without providing the through-hole 25.

In the above embodiments, the relay connection portions 44, 64, and 74 were illustrated protruding upward or laterally, but a relay connection portion may also be employed that protrudes in an inclined direction.

The invention claimed is:

1. A circuit structure comprising:
a circuit board provided with a wiring portion;
a conductor body adhered to one side of the circuit board and provided with a terminal connection portion; and
a terminal that electrically connects the wiring portion of the circuit board to the conductor body,
wherein the terminal includes a conductor body connection portion connected to the terminal connection portion, a circuit board connection portion connected to the wiring portion, and a relay connection portion disposed between the conductor body connection portion and the circuit board connection portion so as to electrically connect the conductor body connection portion with the circuit board connection portion and wherein the circuit board connection portion, the conductor body connection portion and the relay connection portion are disposed along a common axis, and wherein the wherein the circuit board connection portion is elevated relative to the conductor body connection portion.

2. A circuit structure comprising:
a circuit board provided with a wiring portion;
a conductor body adhered to one side of the circuit board; and
a terminal that electrically connects the wiring portion of the circuit board to the conductor body,
wherein the terminal includes a relay connection portion arranged between a portion connected to the wiring portion and a portion connected to the conductor body,
the relay connection portion protrudes past the wiring portion, on the other side of the circuit board, and
the relay connection portion of the terminal includes a first linking portion that extends upward from the portion connected to the conductor body, and a second linking portion that extends downward toward the portion connected to the wiring portion and is shorter than the first linking portion so as to elevate the portion connected to the wiring portion above the portion connector to the conductor body.

3. A circuit structure comprising:
a circuit board provided with a wiring portion;
a conductor body adhered to one side of the circuit board; and
a terminal that electrically connects the wiring portion of the circuit board and the conductor body,
wherein the terminal includes a relay connection portion arranged between a circuit board connection portion that is connected to the wiring portion and a conductor body connection portion that is connected to the conductor body,
the relay connection portion protrudes past the wiring portion, on the other side of the circuit board,
a step portion, and
a first end of the relay connection portion is connected to the step portion and a second end of the relay connection portion, which is opposite the first end, is connected to the circuit board connection portion so as to define a gate shape protruding laterally along the circuit board, the conductor body connection portion and the relay connection portion are linked via a step portion, and the circuit board connection portion and the relay connection portion are and are flush with each other and elevated above the conductor body connecting portion.

4. A terminal that electrically connects a wiring portion provided on a circuit board and a conductor body that is adhered to one side of the circuit board and provided with a terminal connection portion, the terminal comprising:
a conductor body connection portion connected to the terminal connection portion;
a circuit board connection portion connected to the wiring portion; and
a relay connection portion arranged between the conductor body connection portion and the circuit board connection portion so as to electrically connect the conductor body connection portion with the circuit board connection portion and wherein the circuit board connection portion, the conductor body connection portion and the relay connection portion are disposed along a common axis, and wherein the wherein the circuit board connection portion is elevated relative to the conductor body connection portion.

5. The circuit structure according to claim 1, wherein the circuit board includes a through-hole that exposes a terminal connection portion provided on the conductor body in a state adhered to the conductor body, and in the through-hole, a fillet shaped solder is formed spanning from a conductor made of copper exposed at an end of the portion connected to the conductor body to a surface of the terminal connection portion.

6. The circuit structure according to claim 2, wherein the circuit board includes a through-hole that exposes a terminal connection portion provided on the conductor body in a state adhered to the conductor body, and in the through-hole, a fillet shaped solder is formed spanning from a conductor made of copper exposed at an end of the portion connected to the conductor body to a surface of the terminal connection portion.

7. The circuit structure according to claim 3, wherein the circuit board includes a through-hole that exposes a terminal connection portion provided on the conductor body in a state adhered to the conductor body, and in the through-hole, a fillet shaped solder is formed spanning from a conductor made of copper exposed at an end of the portion connected to the conductor body to a surface of the terminal connection portion.

\* \* \* \* \*